United States Patent
Tu et al.

(10) Patent No.: US 6,294,426 B1
(45) Date of Patent: Sep. 25, 2001

(54) METHOD OF FABRICATING A CAPACITOR UNDER BIT LINE STRUCTURE WITH INCREASED CAPACITANCE WITHOUT INCREASING THE ASPECT RATIO FOR A DRY ETCHED BIT LINE CONTACT HOLE

(75) Inventors: Kuo-Chi Tu; Chih-Hsing Yu, both of Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/765,041

(22) Filed: Jan. 19, 2001

(51) Int. Cl.[7] ............................................. H01L 21/8242
(52) U.S. Cl. ..................... 438/255; 438/241; 438/253; 438/254; 438/396; 438/397; 438/398; 438/964
(58) Field of Search .................................. 438/239, 240, 438/241, 250–256, 393–399, 964

(56) References Cited

U.S. PATENT DOCUMENTS

| | | | |
|---|---|---|---|
| 5,338,700 | * 8/1994 | Dennison et al. | 438/396 |
| 5,374,580 | 12/1994 | Baglee et al. | 437/52 |
| 5,401,681 | * 3/1995 | Dennison | 438/396 |
| 5,604,147 | * 2/1997 | Fischer et al. | 438/396 |
| 5,789,304 | * 8/1998 | Fischer et al. | 438/396 |
| 5,824,582 | 10/1998 | Tseng | 438/254 |
| 5,998,257 | * 12/1999 | Lane et al. | 438/253 |
| 6,001,685 | * 12/1999 | Kim | 438/253 |
| 6,020,234 | 2/2000 | Li et al. | 438/253 |
| 6,023,084 | 2/2000 | Tadaki et al. | 257/298 |
| 6,046,093 | * 4/2000 | DeBoer et al. | 438/398 |
| 6,077,742 | 6/2000 | Chen et al. | 438/255 |
| 6,080,620 | * 6/2000 | Jeng | 438/253 |
| 6,100,129 | 8/2000 | Tu et al. | 438/238 |
| 6,110,774 | 8/2000 | Jost et al. | 438/253 |
| 6,221,711 | * 4/2001 | Roberts et al. | 438/239 |
| 6,232,176 | * 5/2001 | Parekh et al. | 438/255 |

* cited by examiner

Primary Examiner—John F. Niebling
Assistant Examiner—Jennifer M. Kennedy
(74) Attorney, Agent, or Firm—George O. Saile; Stephen B. Ackerman

(57) ABSTRACT

A process for fabricating a capacitor under bit line (CUM), DRAM device, featuring increased capacitance, without increasing the aspect ratio for a dry etched, narrow diameter bit line contact hole, has been developed. The process features increasing the vertical space in a capacitor opening, needed to accommodate a capacitor structure with increased vertical dimensions, via selective removal of the top portions of the polysilicon plug structures exposed in the capacitor openings. The depth of a subsequent bit line contact hole, opened to a non-truncated polysilicon plug structure, is therefore not increased as a result of the increase capacitor depth, thus not resulting in an increased aspect ratio for the dry etched, narrow diameter bit line contact hole.

24 Claims, 8 Drawing Sheets

METHOD OF FABRICATING A CAPACITOR UNDER BIT LINE STRUCTURE WITH INCREASED CAPACITANCE WITHOUT INCREASING THE ASPECT RATIO FOR A DRY ETCHED BIT LINE CONTACT HOLE

BACKGROUND OF THE INVENTION (1) Field of the Invention

The present invention relates to methods used to fabricate semiconductor devices, and more specifically to a method used to fabricate a capacitor under bit line (CUB), dynamic random access memory (DRAM), device.

(2) Description of Prior Art

As the density of DRAM cells increase, the dimensions of the DRAM device has to be decreased. The decreasing size of a specific DRAM device adversely influences the ability to provide the needed DRAM capacitance. Increasing the vertical dimensions for DRAM, crown shaped capacitor structures have allowed the desired capacitance values for DRAM devices to be achieved. The increase in these vertical dimensions is usually accomplished via formation of the crown shaped capacitor structure, located in capacitor openings, and in turn formed in thick insulator layers. However the use of thick insulator layer for the capacitor openings, result in high aspect ratio for bit line contact holes, used in for capacitor over bit line (CUB), designs. The additional thickness of insulator, needed to increase the vertical dimension of the crown shaped capacitor structure, results in difficulties when anisotropically dry etching a narrow diameter, deep, opening, to expose a bit line region.

This invention will describe a novel process sequence in which the desired increase in the vertical dimensions of the crown shaped capacitor structure is achieved via formation of the capacitor openings in thicker insulator layers, however without increasing the aspect ratio for the dry etched, narrow diameter bit line contact hole. Prior art, such as Tu et al, in U.S. Pat. No. 6,100,129, as well as Chen et al, in U.S. Pat. No. 6,077,742, describe methods of fabricating DRAM crown shaped capacitor structures. These prior arts however do not describe the novel process sequence of this present invention, where a CUB DRAM device is fabricated with increased capacitance, as a result of increased vertical, crown shaped features, without increasing the aspect ratio of the bit line contact hole opening.

SUMMARY OF THE INVENTION

It is an object of this invention to fabricate a capacitor under bit line (CUB), structure for a DRAM device.

It is another object of this invention to increase DRAM capacitance via removal of a top portion of a polysilicon plug, exposed at the bottom of a capacitor opening in a composite insulator layer, increasing the depth of a capacitor opening, thus allowing a subsequent crown shaped capacitor structure, with increased capacitance resulting from increased vertical dimensions, to be formed, overlying and contacting the shortened polysilicon plug located in the capacitor opening.

It is still another object of this invention to prevent removal of a top portion of a polysilicon plug used for contact to an overlying bit line structure, thus not increasing the aspect ratio for a anisotropic dry etched, bit line contact hole opening, used to expose the top surface of the non-shortened polysilicon plug.

In accordance with the present invention a method of forming a CUB DRAM device, featuring increased capacitance, resulting from increasing the depth of a capacitor opening in a composite insulator layer, without however increasing the aspect ratio for a bit line contact hole, formed in the same composite insulator layer, is described. After formation of transfer gate transistors, and deposition of a first insulator layer, self-aligned contact (SAC), openings are formed in the first insulator layer, exposing source/drain regions of the transfer gate transistors. After formation of polysilicon plugs, in the SAC openings, a composite insulator layer, comprised of a thick silicon oxide layer, and a thin overlying silicon nitride layer, is deposited. Openings are made in the composite insulator layer, and in a top portion of the first insulator layer, exposing top portions of a first group of polysilicon plugs to be used for contact to a subsequent, overlying capacitor structure, while the same composite insulator layer, located in a region overlying a second polysilicon plug, to be used for contact to a subsequent bit line structure, remains unremoved. Selective removal of the exposed portions of the first group of polysilicon plugs, result in a capacitor opening formed in both the composite insulator layer, and in a top portion of the first insulator layer, exposing the top surface of the first group of polysilicon plugs, now embedded only between the gate structures of the transfer gate transistors. Crown shaped capacitor structures, comprised of: an underlying bottom electrode structure, featuring hemispherical grain silicon; a capacitor dielectric layer; and an overlying top electrode structure; are next formed in the capacitor opening, overlying and contacting the truncated first group of polysilicon plugs. After deposition of a second insulator layer, a bit line contact hole is opened in the second insulator layer, and in the composite insulator layer, exposing the top surface of the non-truncated, second polysilicon plug.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
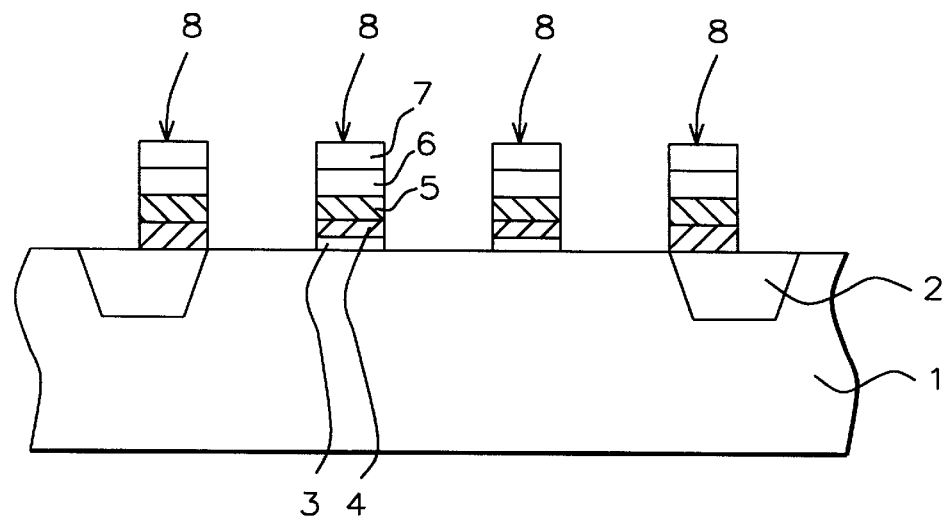
FIGS. 1–13, which schematically, in cross-sectional style, describe key stages of fabrication of a CUB, DRAM device, featuring increased capacitance and a reduced aspect ratio for definition of the bit line contact hole, via selective shortening of the polysilicon plugs used for contact to overlying capacitor structures.

The method of fabricating a DRAM capacitor under bit line (CUB), device, featuring the selective truncating of capacitor polysilicon plugs performed to increase the vertical dimensions of a capacitor opening, thus allowing the accommodation of a subsequent larger surface area capacitor structure, while reducing the aspect ratio of a dry etched bit line contact hole opening, exposing the top surface of a non-truncated polysilicon plug, will now be described in detail. A P type, semiconductor substrate 1, comprised of single crystalline silicon with a <100> crystallographic orientation, is used and schematically shown in FIG. 1. Isolation regions 2, are next formed, comprised of either insulator filled, shallow trenches, or of thermally grown, field oxide regions. Silicon dioxide gate insulator layer 3, is the thermally grown to a thickness between about 50 to 100 Angstroms. Insulator capped gate structures 8, shown schematically in FIG. 1, are next formed on silicon dioxide gate structure 3. Insulator layer capped gate structures 8, are comprised of: an underlying layer of polysilicon layer 4, obtained via low pressure chemical vapor deposition (LPCVD), procedures, to a thickness between about 500 to 1500 Angstroms; tungsten silicide layer 5, obtained via LPCVD procedures, to a thickness between about 500 to 1500 Angstroms; silicon dioxide layer 6, obtained via LPCVD or plasma enhanced chemical vapor deposition (PECVD), procedures, to a thickness between about 500 to 1500 Angstroms, using tetraethylorthosilicate as a source; and an overlying silicon nitride layer, obtained via LPCVD or PECVD procedures, at a thickness between about 500 to 1500 Angstroms. Polysilicon layer 4, is a doped polysilicon layer, either doped in situ during deposition via the addition of arsine, or phosphine, to a silane ambient, or grown intrinsically then doped via implantation of arsenic or phosphorous ions. Conventional photolithographic and anisotropic procedures, using $CF_4$ and $CHF_3$ as an etchant for silicon nitride layer 7, as well as for silicon oxide layer 6, and using $Cl_2$ or $SF_6$ as an etchant for tungsten silicide layer 5, and for polysilicon layer 4, are employed to define insulator capped gate structures 8, shown schematically in FIG. 1. Removal of the photoresist shape used for definition of insulator capped gate structures 8, is accomplished via plasma oxygen ashing and careful wet cleans.

Figure 2:
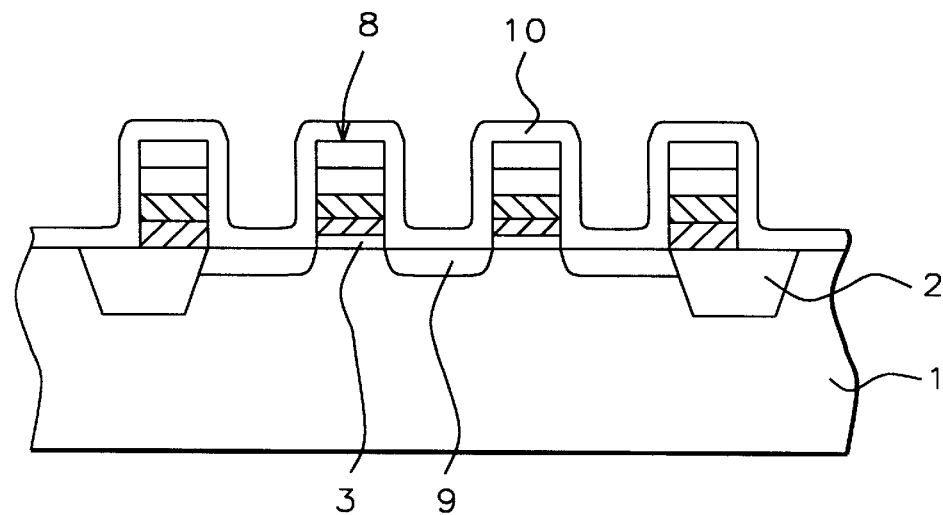

Source/drain regions 9, are next formed in regions of semiconductor substrate 1, not covered by insulator capped gate structures 8, via implantation of arsenic or phosphorous ions, at an implant energy between about 20 to 40 KeV, and at an implant dose between about 1E13 to 1E14 atoms/cm$^2$. silicon nitride layer 10, shown schematically in FIG. 2, is next deposited via LPCVD or PECVD procedures, at a thickness between about 300 to 500 Angstroms. Silicon nitride layer 10, can either be subjected to a blanket, anisotropic, reactive ion etching (RIE), procedure, to form silicon nitride spacers on the sides of insulator capped gate structures 8, or the formation of silicon nitride spacers can be delayed, then subsequently formed during the subsequent formation of a self-aligned contact (SAC), opening. The latter procedure, formation of spacers during the SAC opening, is used in this description, offering protection of silicon nitride layer 7, which can occur during a spacer overetch cycle which in turn can occur with the former procedure.

Figure 3:
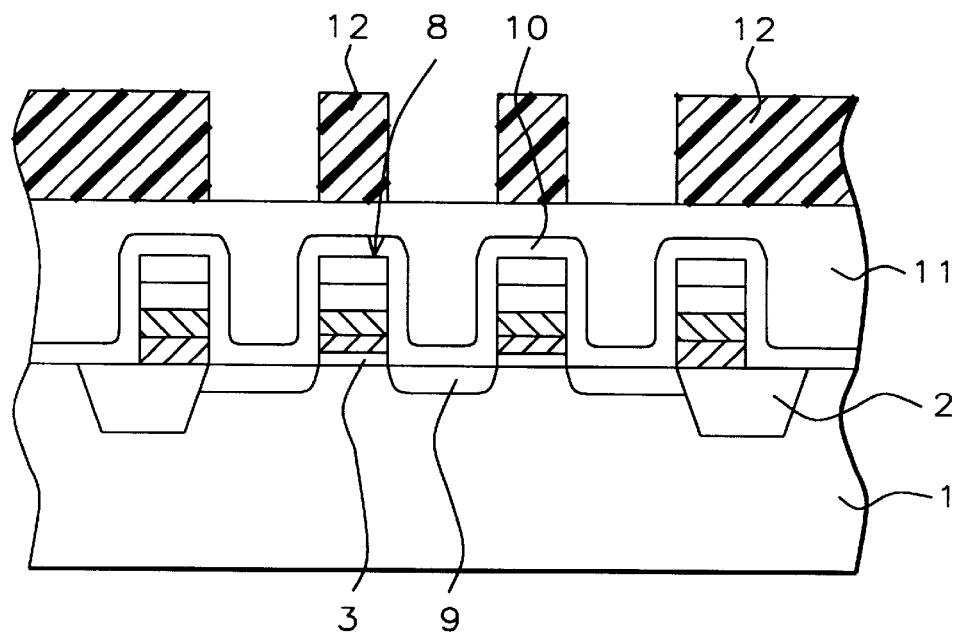
Figure 4:
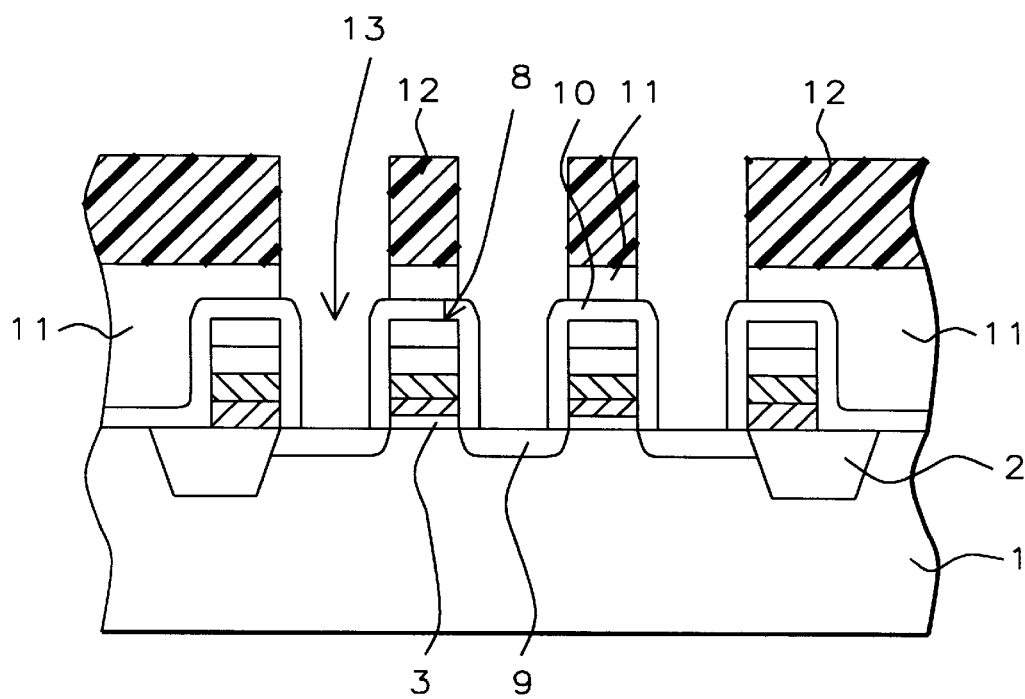

The formation of SAC openings 13, is next addressed, and schematically described in FIGS. 3-4. Insulator layer 11, comprised of either silicon oxide, or boro-phosphosilicate glass (BPSG), is first deposited via LPCVD or PECVD procedures, at a thickness between about 6000 to 9000 Angstroms. A chemical mechanical polishing (CMP), procedure is then employed for planarization purposes, resulting in a smooth top surface topography for insulator layer 11. This is schematically shown in FIG. 3. Photoresist shapes 12, are next formed on insulator layer 11, and used as an etch mask to allow SAC openings 13, to be selectively formed between insulator capped gate structures 8. An anisotropic RIE procedure, using CHF3 as an etchant, is employed to selectively define the first portion of SAC opening 13, in insulator layer 11, then $Cl_2$ is used to complete SAC opening 13, via removal of e the portion of silicon nitride layer 10, exposed at the bottom of SAC opening 13, resulting in exposure of a portion of the top surface of source/drain region 9. The width of SAC opening 13, between about 2000 to 4000 Angstroms, is the space between the insulator capped gate structures, now coated with silicon nitride sidewall spacers defined from silicon nitride layer 10. This is schematically shown in FIG. 4.

Figure 5:
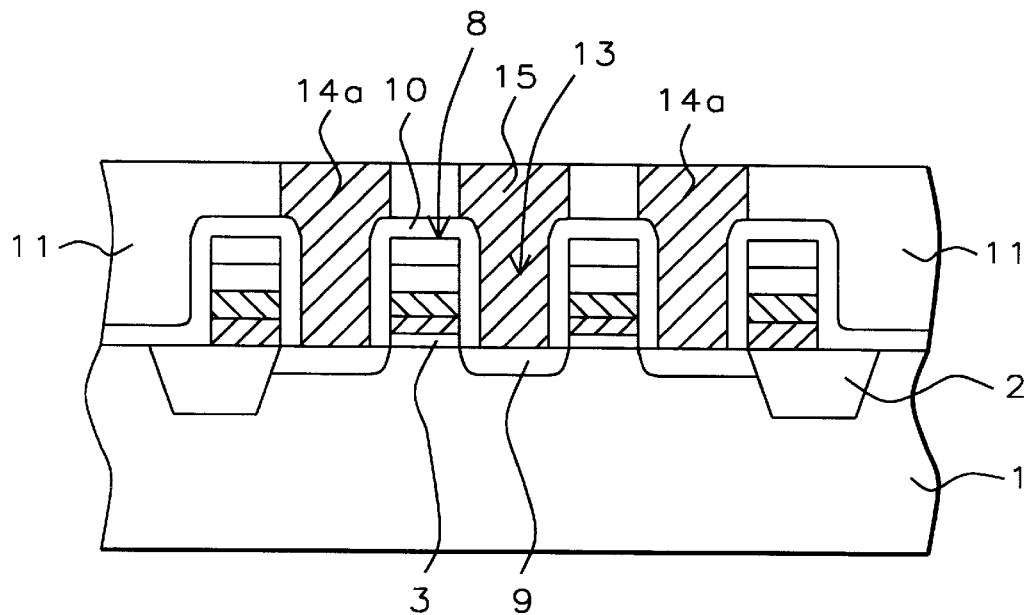

After removal of photoresist shapes 12, via plasma oxygen ashing and careful wet cleans, a polysilicon layer is deposited, at a thickness between about 2000 to 4000 Angstroms, via an LPCVD procedures, completely filling SAC openings 13. The polysilicon layer is doped in situ during deposition via the addition of arsine, or phosphine, to a silane ambient. A CMP procedure, or a selective RIE procedure, using $Cl_2$ or $SF_6$ as an etchant, is used to remove polysilicon from the top surface of insulator layer 11, resulting in polysilicon plug structures 14a, and polysilicon plug structure 15, in SAC openings 13. Polysilicon plug structures 14a, will be used for subsequent contact to overlying capacitor structures, while polysilicon plug structure 15, will be used for contact to an overlying bit line structure. The result of these procedures is schematically shown in FIG. 5.

Figure 6:
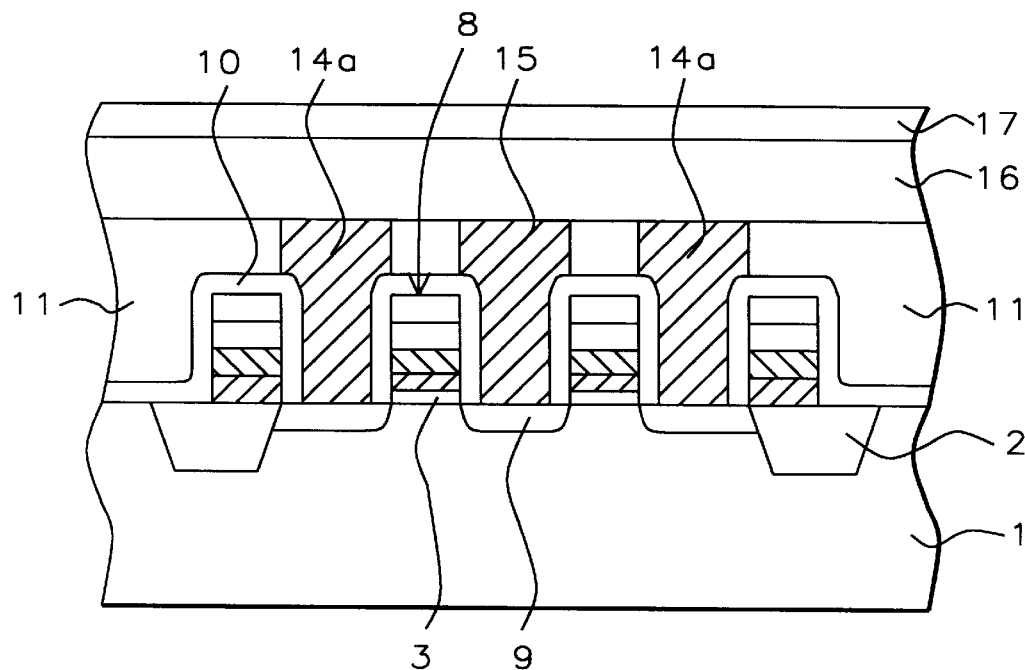
Figure 7:
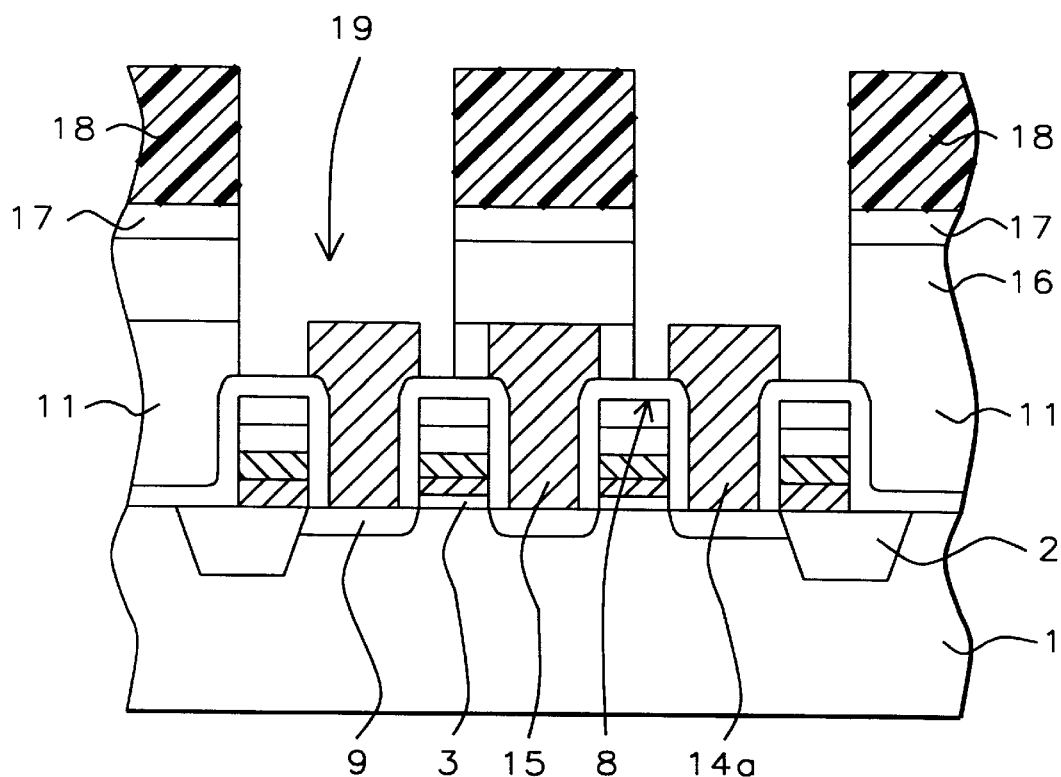

A composite insulator layer, comprised of underlying silicon oxide layer 16, and overlying thin silicon nitride stop layer 17, is next deposited and shown schematically in FIG. 6. Silicon oxide layer 16, is obtained via LPCVD or PECVD procedures to a thickness between about 8000 to 15000 Angstroms, while silicon nitride layer 17, is also obtained using LPCVD or PECVD procedures, at a thickness between about 300 to 500 Angstrom. If desired a BPSG layer can be used in place of silicon oxide layer 16. Photoresist shape 18, is then used as an etch mask to allow definition of capacitor, or storage node openings 19, to be accomplished via an anisotropic RIE procedure using $Cl_2$ as an etchant for silicon nitride layer 17, and using $CHF_3$ of $CF_4$ as an etchant for silicon oxide layer 16, and for silicon oxide layer 11. Capacitor openings 19, are defined with a width larger than the space between insulator capped gate structures 8. That in addition to high etch rate ratio of silicon oxide to silicon nitride, using either $CHF_3$ or $CF_4$ as an etchant, allows selective removal of exposed silicon oxide layer 11, however with the dry etching procedure terminating at the appearance of silicon nitride layer 10, thus exposing the portions of polysilicon plugs 14a, that were previously embedded in a top portion of silicon oxide layer 11. This is schematically shown in FIG. 7.

Figure 8:
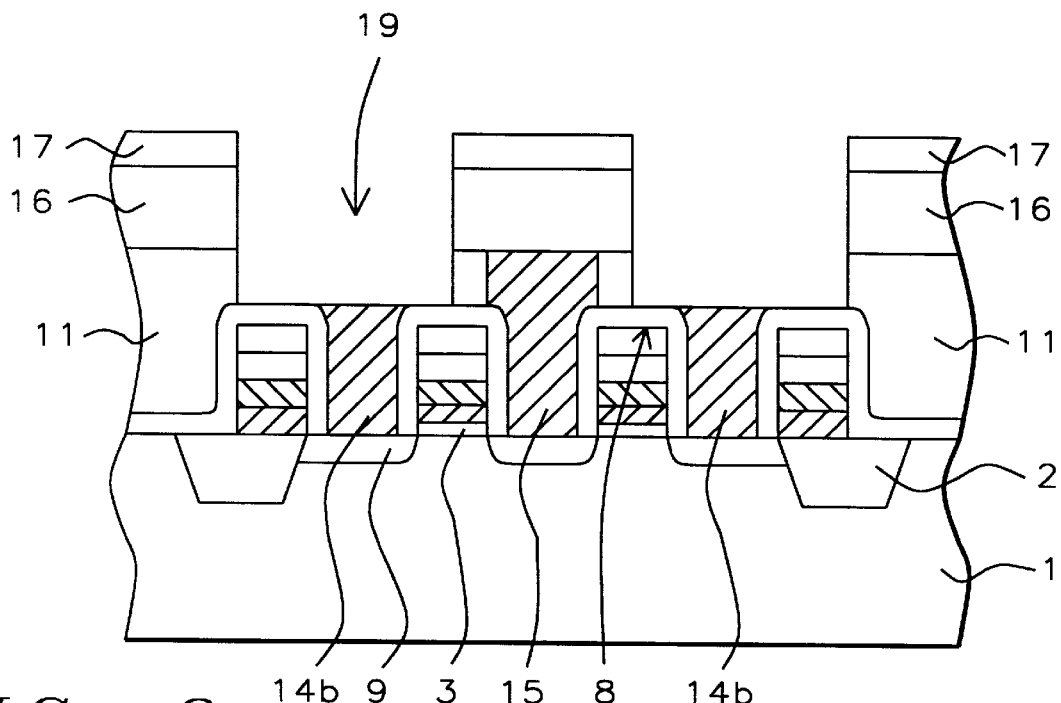

After removal of photoresist shape 18, via plasma oxygen ashing and careful wet cleans, a critical, blanket dry etch procedure is performed to selectively remove the portions of polysilicon plugs 14a, exposed in capacitor openings 19. The selective, RIE procedure is performed using $Cl_2$ as an etchant for polysilicon, using thin silicon nitride layer 17, as a hard mask, as well as using both silicon nitride layer 17, and silicon nitride layer 10, as etch stop layers. The etch rate ratio of polysilicon to silicon nitride is between about 5 to 10, to 1. The truncating of polysilicon plugs 14a, result in the attainment of shorter polysilicon plugs 14b. The truncating or shortening of the polysilicon plugs increases the depth of capacitor openings 19, with the capacitor openings now comprised in a top portion of silicon oxide layer 11, as well as in the overlying composite insulator layer. The increase in depth of the capacitor openings will result in an increase in the vertical dimension of a subsequent capacitor structure, formed in capacitor opening 19. This will result in the desired capacitance increase, when compared to counterpart capacitor structures formed in a capacitor opening located only in the overlying composite insulator layer. Polysilicon plug structure 15, to be used for contact to an overlying bit line structure, remained protected by silicon nitride hard mask layer 17, during the truncation of the polysilicon plug structures to be used with overlying capacitor structures. If polysilicon plug 15, were shortened, the aspect ratio of a dry etching procedure, used to open a bit line contact hole to polysilicon plug 15, would be increased, adding unwanted process complexity. The result of this key process step is schematically shown in FIG. 8.

Figure 9:
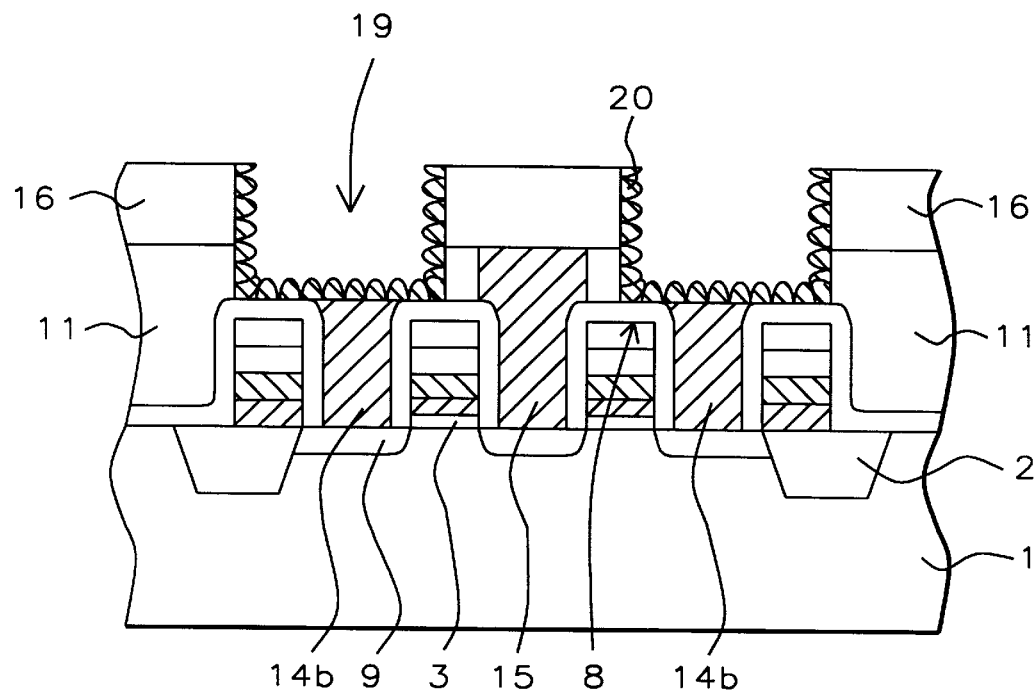

Formation of a hemispherical grain (HSG), silicon, bottom electrode structure 20, is next addressed and schematically shown in FIG. 9. This is accomplished via deposition of an amorphous silicon layer, obtained via LPCVD procedures at a thickness between about 300 to 500 Angstroms, followed by the deposition of HSG seeds, on the amorphous silicon layer. An anneal procedure, performed at a temperature between about 750 to 850° C., is used to convert the HSG seeds, on the amorphous silicon layer, to a larger grain HSG layer on the underlying amorphous silicon layer. A CMP procedure is then employed to remove the portions of HSG-amorphous silicon layer, from the top surface of silicon nitride layer 17, followed by the removal of silicon nitride layer 17, from the top surface of silicon oxide layer 16. This results in the definition of bottom electrode, or storage node structure 20, comprised of HgG on amorphous silicon, in capacitor opening 19, overlying and contacting, the top surface of truncated polysilicon plug 14b. Again the vertical dimension of bottom electrode structure 20, has been increased via the deepening of capacitor opening 19, which in turn has been realized via truncation of the polysilicon plugs.

Figure 10:
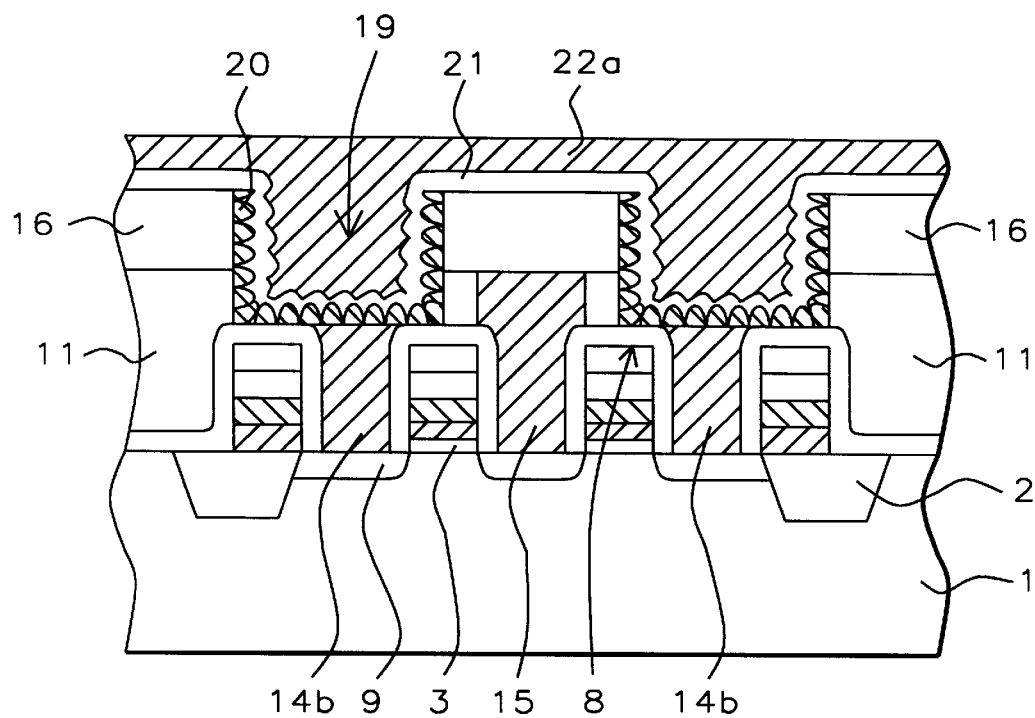
Figure 11:
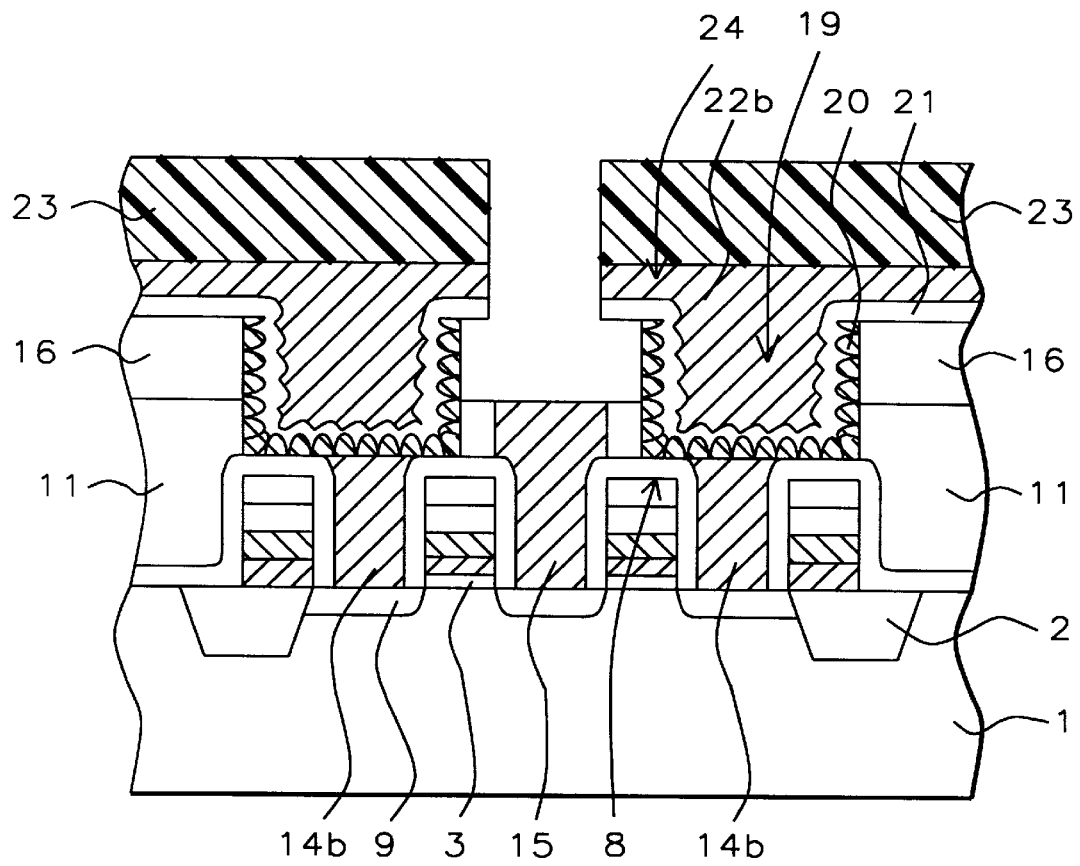

Capacitor dielectric layer 21, comprised of tantalum oxide, silicon oxynitride, silicon nitride, or silicon oxide, is next formed via chemical vapor deposition procedures, to a thickness between about 40 to 80 Angstroms. Deposition of polysilicon layer 22a, accomplished via LPCVD procedures, at a thickness between about 700 to 1500 Angstroms, is next performed completely filling capacitor openings 19. This is schematically shown in FIG. 10. Polysilicon layer 22a, is doped in situ during deposition, via the addition of arsine, or phosphine, to a silane ambient. Photoresist shape 23, is next employed as an etch mask to allow definition of polysilicon top plate, or top electrode structure 22b, to be performed. An anisotropic RIE procedure, using $Cl_2$ or $SF_6$ as an etchant, is used to remove the portions of polysilicon layer 22a, and the portions of capacitor dielectric layer 21, not protected by photoresist shape 23, resulting in a damascene type, capacitor structure 24, in capacitor opening 19, with capacitor structure 24, comprised of overlying top electrode structure 22b, capacitor dielectric layer 21, and underlying, storage node electrode 20. This is schematically shown in FIG. 11.

Figure 12:
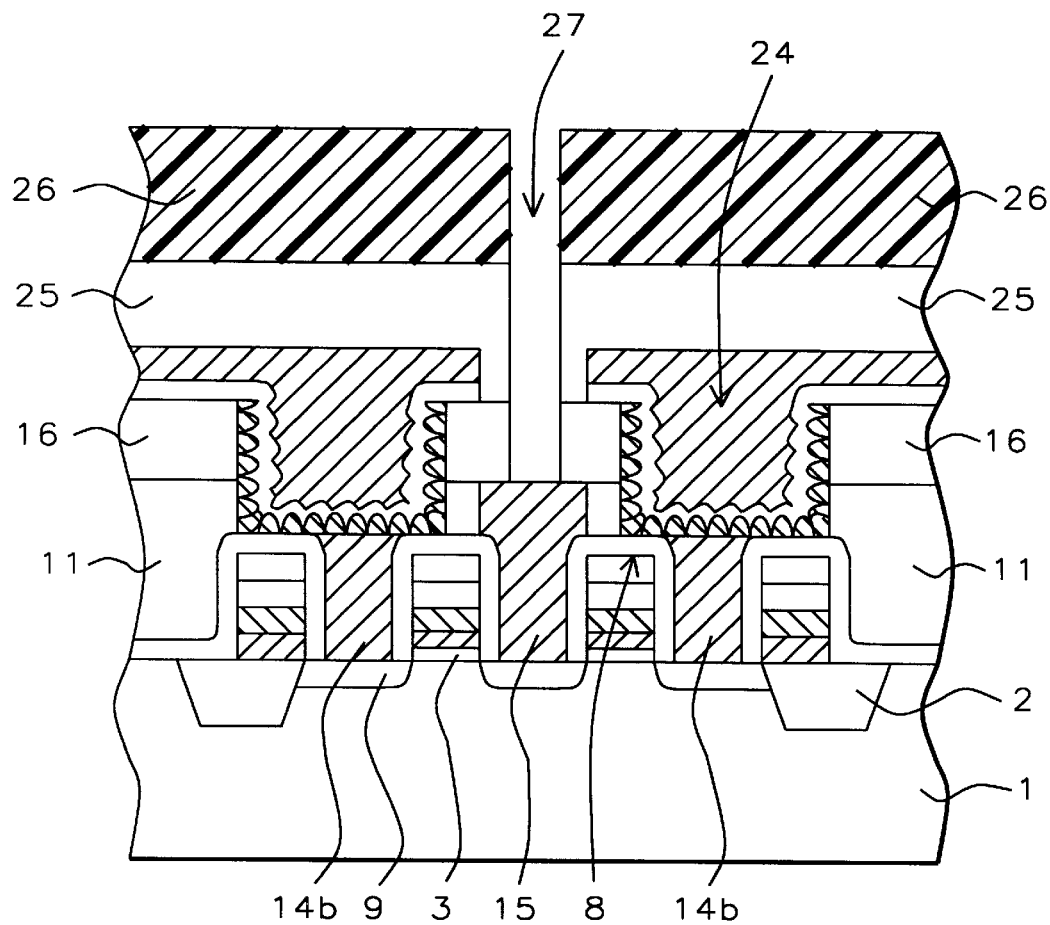
Figure 13:
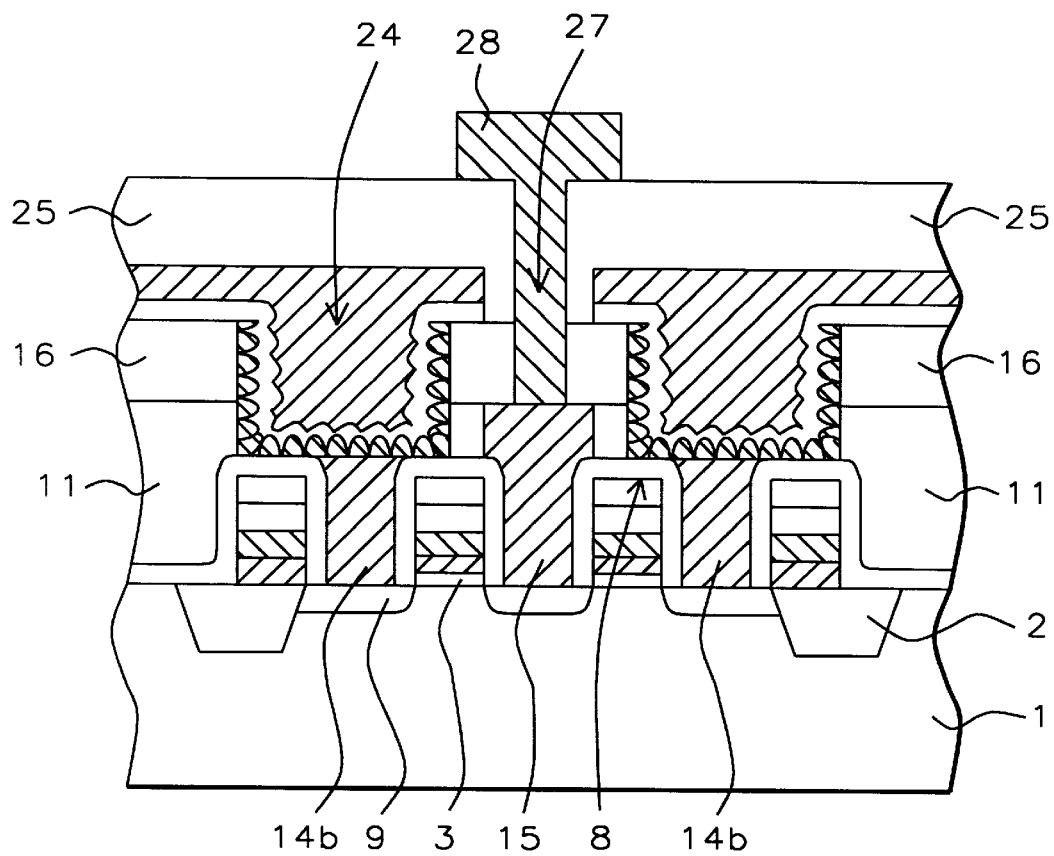

The definition of a bit line contact hole opening, and the formation of a bit line contact structure, will now be addressed and schematically shown in FIGS. 12–13. Silicon oxide layer 25, is next deposited, via LPCVD or PFCVD procedures, to a thickness between about 3000 to 5000 Angstroms. If desired silicon oxide layer 25, can be replaced with a BPSG layer. Photoresist shape 26, is then formed and used as an etch mask to allow definition of a narrow diameter, bit line contact hole 27, to be created in silicon oxide layer 25, and in silicon oxide layer 16, exposing a portion of the top surface of polysilicon plug 15. This is accomplished via an anisotropic RIE procedure using $CHF_3$ or $CF_4$ as an etchant. The diameter of bit line contact hole 27, is between about 2500 to 3500 Angstroms. The ability to protect polysilicon plug 15, during the truncation of polysilicon plugs 14a, allowed a lower aspect ratio of bit line contact hole 27, to be realized. If polysilicon plug 15, would have experienced the polysilicon truncation procedure, needed to increase capacitance, bit line contact hole 27, would have had to be extended into a top portion of silicon oxide layer 11, resulting in the unwanted increase of the bit line contact hole aspect ratio, introducing the process difficulties associated with the increased aspect ratio. This is schematically illustrated in FIG. 12.

After removal of photoresist shape 26, via plasma oxygen ashing and careful wet cleans, bit line structure 28, is formed in bit line contact hole 27. If desired silicon nitride spacers, not shown in the drawings, can be formed on the sides of bit line contact hole 27, prior to formation of bit line structure 28. This can be accomplished via deposition of a silicon nitride layer, followed by a blanket, anisotropic RIE procedure, resulting in the creation of thin silicon nitride spacers, only on the sides of the bit line contact hole, offering additional insulation between a bit line structure and capacitor structures 24. A conductive layer, such as tungsten is then deposited via LPCVD procedures, at a thickness between about 4000 to 5000 Angstroms, completely filling bit line contact hole 27. If desired an underlying layer of titanium nitride, not shown in the drawings, can be deposited via CVD or via plasma vapor deposition procedures, prior to deposition of tungsten, to behave as a barrier layer preventing the reaction products of the tungsten deposition from attacking the exposed silicon oxide surfaces. A photoresist shape, not shown in the drawings, is next formed on the top surface of the conductive layer, then used as an etch mask to allow definition of bit line structure 28, to be accomplished via a RIE procedure, employing $Cl_2$ or $SF_6$ as an etchant. This is schematically shown in FIG. 13. The photoresist shape used for definition of bit line structure 28, is again removed via plasma oxygen ashing and careful wet cleans.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a capacitor under bit line structure, for a dynamic random access memory (DRAM), device, on a semiconductor substrate, comprising the steps of:

forming transfer gate transistors on said semiconductor substrate, comprised of gate structures located on an underlying gate insulator layer, with source/drain regions located in a region of said semiconductor substrate not covered by said gate structures;

depositing a first composite insulator layer comprised of a first silicon nitride layer, and an overlying first silicon oxide layer;

forming self-aligned contact (SAC), openings in said first composite insulator exposing top portions of said source/drain regions;

forming conductive plugs in said SAC openings;

depositing a second composite insulator layer comprised of a second silicon oxide layer, and an overlying, second silicon nitride layer;

forming capacitor openings in said second composite insulator layer, and in a first portion of said first silicon oxide layer, exposing a top portion of a first group of conductive plugs to be used for storage node contacts, while a second conductive plug remains unexposed;

selectively removing said top portion of said first group of conductive plugs exposed in said capacitor openings, resulting in truncated conductive plugs embedded between said gate structures;

forming capacitor structures in said capacitor openings, with said capacitor structures comprised of an underlying storage node structure, a capacitor dielectric layer, and an overlying top electrode structure, with said storage node structure, overlying and contacting said truncated conductive plugs, and with said second silicon nitride layer removed from the top surface of said second silicon oxide layer during definition of said storage node structure;

depositing a third silicon oxide layer;

forming a bit line contact hole in said third silicon oxide layer, and in said second silicon oxide layer, exposing a portion of the top surface of said second conductive plug; and forming a bit line structure in said bit line contact hole, overlying and contacting the top surface of said second conductive plug.

2. The method of claim 1, wherein said first silicon nitride layer is obtained via LPCVD or PECVD procedures, at a thickness between about 300 to 500 Angstroms.

3. The method of claim 1, wherein said first silicon oxide layer is obtained via LPCVD or PECVD procedures, at a thickness between about 6000 to 9000 Angstroms.

4. The method of claim 1, wherein said conductive plugs are comprised of polysilicon, obtained via LPCVD procedures, and doped in situ during deposition via the addition of arsine, or phosphine, to a silane ambient.

5. The method of claim 1, wherein said second silicon oxide layer is obtained via LPCVD or PECVD procedures, at a thickness between about 8000 to 15000 Angstroms.

6. The method of claim 1, wherein said second silicon nitride layer is obtained via LPCVD or PECVD procedures, at a thickness between about 300 to 500 Angstroms.

7. The method of claim 1, wherein said capacitor openings are formed via an anisotropic RIE procedure using $Cl_2$ as an etchant for said second silicon nitride layer, while using $CF_4$ or $CHF_3$ as an etchant for said second silicon oxide layer, and for said top portion of said first silicon oxide layer.

8. The method of claim 1, wherein said top portions of said first group of conductive plugs are selectively removed using $Cl_2$ as an etchant, with a etch rate ratio of polysilicon to silicon nitride, of between about 5 to 10, to 1.

9. The method of claim 1, wherein said storage node structure is comprised of a hemispherical grain silicon layer, on an underlying amorphous silicon layer.

10. The method of claim 1, wherein said capacitor dielectric layer, at a thickness between about 40 to 80 Angstroms, is chosen from a group that contains; tantalum oxide, silicon oxynitride, silicon nitride, and silicon oxide.

11. The method of claim 1, wherein said top electrode structure is comprised of a polysilicon, formed from a polysilicon layer which in turn is obtained via LPCVD procedures, and doped in situ during deposition via the addition of arsine, or phosphine, to a silane ambient.

12. The method of claim 1, wherein said third silicon oxide layer is obtained via LPCVD or PECVD procedures, at a thickness between about 3000 to 5000 Angstroms.

13. The method of claim 1, wherein the diameter of said bit line contact hole, formed in in said third silicon oxide layer and in said second silicon oxide layer, is between about 2500 to 3500 Angstroms.

14. The method of claim 1, wherein said bit line structure is comprised of tungsten, and an underlying titanium nitride barrier layer.

15. A method of fabricating a capacitor under bit line (CUB), structure for a DRAM device, on a semiconductor substrate, featuring the selective truncation of polysilicon plug structures exposed in capacitor openings, allowing increased capacitance to be achieved via accommodation of larger vertical dimensioned capacitor structures, and without increasing the aspect ratio of a dry etched, narrow diameter, bit line contact hole, comprising the steps of:

forming transfer gate transistors on said semiconductor substrate, comprised of insulator capped gate structures on an underlying silicon dioxide gate insulator layer, with source/drain regions located in a region of said semiconductor substrate not covered by said insulator capped gate structures;

depositing a silicon nitride layer;

depositing a first silicon oxide layer;

planarizing said first silicon oxide layer;

forming self-aligned contact (SAC), openings in said first silicon oxide, and in said silicon nitride layer, resulting in silicon nitride spacers on the sides of said insulator capped gate structures, and with said SAC opening exposing a portion of the top surface of said source/drain region;

depositing a first polysilicon layer completely filling said SAC openings;

removing portions of said first polysilicon layer from the top surface of said first silicon oxide layer forming said polysilicon plug structures in said SAC openings;

depositing a second silicon oxide layer;

depositing a thin silicon nitride stop layer;

forming said capacitor openings in said thin silicon nitride stop layer, in said second silicon oxide layer, and in a top portion of said first silicon oxide layer, exposing top portions of a first group of polysilicon plug structures, while the bottom portions of said polysilicon plug structures remain embedded between insulator capped gate structures, and while a second polysilicon plug structure remains covered by overlying thin silicon nitride stop layer and by said second silicon oxide layer;

selectively removing said top portions of said first group of polysilicon plug structures exposed in said capacitor opening, to create truncated polysilicon plug structures in said capacitor openings, shorter in length than said second polysilicon plug structure;

forming storage node structures in said capacitor openings, with each storage node structure comprised of hemispherical grain (HSG), silicon layer, on an underlying amorphous silicon layers, with said thin silicon nitride stop layer removed during definition of said storage node structures;

depositing a capacitor dielectric layer;

depositing a second polysilicon layer, completely filling said capacitor openings;

patterning of said second polysilicon layer to form top electrode structure of said capacitor structure, in said capacitor opening, with said capacitor structure overlying and contacting said truncated polysilicon plug structures, and with each capacitor structure comprised of a top electrode structure, comprised with said capacitor dielectric layer, and comprised with said storage node structure;

depositing a third silicon oxide layer;

performing a dry etch procedure to create said narrow diameter, bit line contact hole in said third silicon oxide layer, and in said second silicon oxide layer, exposing a portion of said second polysilicon plug structure, embedded in said first silicon oxide layer;

depositing a titanium nitride-tungsten layer, completely filling said narrow diameter, bit line contact hole; and patterning of said titanium nitride-tungsten layer, to form a bit line structure in said narrow diameter, bit line contact hole.

16. The method of claim 15, wherein said silicon nitride layer is obtained via LPCVD or PECVD procedures, at a thickness between about 300 to 500 Angstroms.

17. The method of claim 15, wherein said first silicon oxide layer is obtained via LPCVD or PECVD procedures, at a thickness between about 6000 to 9000 Angstroms.

18. The method of claim 15, wherein said first polysilicon layer, used for said polysilicon plug structures, is obtained via LPCVD procedures, and doped in situ during deposition via the addition of arsine, or phosphine, to a silane ambient.

19. The method of claim 15, wherein said second silicon oxide layer is obtained via LPCVD or PECVD procedures, at a thickness between about 8000 to 15000 Angstroms.

20. The method of claim 15, wherein said thin silicon nitride stop layer is obtained via LPCVD or PECVD procedures, at a thickness between about 300 to 500 Angstroms.

21. The method of claim 15, wherein said capacitor openings are formed via an anisotropic procedure using $Cl_2$ as an etchant for said silicon nitride stop layer, while using $CF_4$ or $CHF_3$ as an etchant for said second silicon oxide layer, and for said top portion of said first silicon oxide layer.

22. The method of claim 15, wherein said truncated polysilicon plug structures are formed via selective removal of top portions of said first group of polysilicon plug structures, using $Cl_2$ as an etchant, with a etch rate ratio of said polysilicon to silicon nitride, of between about 5 to 10, to 1.

23. The method of claim 15, wherein said third silicon oxide layer is obtained via LPCVD or PECVD procedures, at a thickness between about 3000 to 5000 Angstroms.

24. The method of claim 15, wherein the diameter of said narrow diameter bit line contact hole, formed in said third silicon oxide layer, and in said second silicon oxide layer, is between about 2500 to 3500 Angstroms.

* * * * *